United States Patent [19]

Kiraly

[11] 4,400,642
[45] Aug. 23, 1983

[54] PIEZOELECTRIC COMPOSITE MATERIALS

[75] Inventor: Louis J. Kiraly, Brookpark, Ohio

[73] Assignee: The United States of America as represented by the Administrator of the National Aeronautics and Space Administration, Washington, D.C.

[21] Appl. No.: 397,281

[22] Filed: Jul. 12, 1982

[51] Int. Cl.³ .................... H04R 17/00; H01L 41/04
[52] U.S. Cl. .................... 310/332; 310/800; 428/294; 428/421; 428/422
[58] Field of Search ............... 428/292, 294, 295, 421, 428/422; 310/800, 311, 332

[56] References Cited

U.S. PATENT DOCUMENTS

| | | | |
|---|---|---|---|
| 3,885,758 | 5/1975 | Croswell, Jr. | 244/44 |
| 3,930,626 | 1/1976 | Croswell, Jr. | 244/44 |
| 3,971,250 | 7/1976 | Taylor | 73/88.5 |

*Primary Examiner*—James J. Bell
*Attorney, Agent, or Firm*—Norman T. Musial; John R. Manning; Gene E. Shook

[57] ABSTRACT

A laminated structural device has the ability to change shape, position and resonant frequency without using discrete motive components. The laminate (10) may be a combination of layers (14,16) of a piezoelectrically active, non-conductive matrix material as shown in FIG. 1. A power source (22) selectively places various levels of charge an electrically conductive filaments (18,20) imbedded in the respective layers to produce various configurations shown in FIGS. 2 to 5 in a predetermined manner. The layers may be electrically conductive having imbedded piezoelectrically active filaments. A combination of layers of electrically conductive material may be laminated to layers of piezoelectrically active material.

8 Claims, 5 Drawing Figures

PIEZOELECTRIC COMPOSITE MATERIALS

ORIGIN OF THE INVENTION

The invention described herein was made by an employee of the U.S. Government and may be manufactured or used by or for the Government without the payment of any royalties thereon or therefor.

TECHNICAL FIELD

This invention is concerned with utilizing materials whose properties can be varied and controlled directly in applications which presently utilize electromechanical system components. The invention is particularly directed to a laminated composite structure that is constructed with layers of materials that are either piezoelectrically active or electrically conductive.

Piezoelectric devices have been proposed with electrodes cemented onto external surfaces. The present structure offers much simpler solutions to complex system designs in that the medium may be made to change shape and position directly without the need for discreet motive components. Thus, the materials can perform various electro-mechanical functions without complex electro-mechanical systems by the direct electronic control of a material continuum.

Piezoelectric devices have been used primarily as crystal resonators, spark producing devices, and transducer elements. Piezoelectric substrates have been used to generate surface waves electrically with surface deposited electrodes. Mechanical surface waves generated in this manner are propagated to another set of surface electrodes where the electric field associated with the waves is picked up to effect complex signal transforms and signal delay lines.

BACKGROUND ART

Taylor U.S. Pat. No. 3,971,250 describes a sensing transducer comprising a plurality of electric layers formed from materials having both pyroelectric and piezoelectric characteristics, such as polyvinylidene fluoride ($PVF_2$). The medium layer can be bent about the longitudinal midpoint of an insulative layer by selective application of a charge.

Croswell, Jr. U.S. Pat. No. 3,885,758 discloses an arrangement for controlling the angular configuration of a fluid controlled surface by selectively controlling the expansion and contraction of a plurality of structural wires in the upper and lower skin of an airplane wing. The device contemplates the use of various composite materials which will contract or restrict when subjected to an electrical current. Also, the structural elements that will expand or contract to produce the curvature of an aerodynamic surface may be constructed of an electrostrictive material, such as crystalline barium titanate ceramic.

Croswell, Jr. U.S. Pat. No. 3,930,626 discloses the use of structural wires employed to control the angular configuration of a fluid control system. According to the patent the structural elements that will expand or contract to produce curvature of the aerodynamic surface may include piezoelectric materials.

DISCLOSURE OF INVENTION

In accordance with the present invention, various piezoelectrically active and electrically conductive composite layers are assembled to form a laminated structural member. Deformation of the laminated structure is governed by the selective application of charge to electrically conductive elements. Because of the piezoelectric effect it is theoretically possible to effect a strain without stress or to change the resonant characteristics of the device.

It is contemplated the laminate may be a combination of layers that are electrically conductive, piezoelectrically active, electrically conductive with imbedded piezoelectric filaments or fibers, or piezoelectrically active with imbedded electrically conductive filaments. In the preferred embodiment the laminate is a piezoelectrically active, non-conductive matrix material with imbedded electrically conductive filaments.

Active control of the laminate shape, size and gross deflections provide for both static and dynamic applications. This feature may be used as direct control of aerodynamic surfaces, active control of precise structural elements, prosthetic devices, flow restrictors, as well as conveyors for solids and liquids.

BRIEF DESCRIPTION OF THE DRAWING

The details of the invention will be described in connection with the accompanying drawings wherein.

BEST MODE FOR CARRYING OUT THE INVENTION

Piezoelectric material can be manufactured by solidifying piezoelectrically polar substances in the presence of an applied electric field to align the polar structure. This ability to manufacture piezoelectric materials, such as lithium niobate, facilitates the fabrication of structures using piezoelectric composite materials made in accordance with the present invention.

Figure 1:
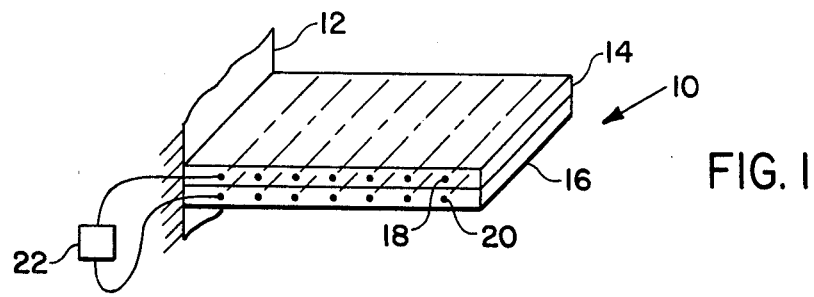
FIG. 1 is a perspective view of a cantilevered structural element utilizing laminated composite materials of various piezoelectrically active and electrically conductive layers constructed in accordance with the present invention.

Various piezoelectrically active and electrically conductive composite layers are assembled in specific orientations as a laminated structural member. More particularly, a structural element 10, such as a beam, is constructed in this manner, and is cantilevered at one end from a wall 12 as shown in FIG. 1. The beam comprises a layer 14 of a piezoelectrically active material laminated to another layer 16 of a similar material.

A plurality of conductive filaments 18 are imbedded in the layer 14. The filaments 18 are substantially parallel and extend along the width of the beam in the oriented piezoelectric matrix material of the layer 14. A plurality of conductive filaments 20 are similarly imbedded in the layer 16.

The orientation and form of the structural element 10 is governed by the selective control of charge placement in the electrically conductive filaments 18 and 20 from a power source 22. Without any charge applied to the filaments 18 and 20, the beam is substantially flat as shown in FIG. 1.

Various distortional modes of the beam may be induced by selective placement of various levels of charge in the filaments 18 and 20, as shown in FIGS. 2 to 5 inclusive. The charge within each of the filaments 18 and 20 is indicated by positive, +, or negative, −, voltage levels and is controlled separately by the source 22. It will be appreciated that the applied charges also may be changed in real time by the source 22 to generate various kinds of dynamic responses.

Figure 2:
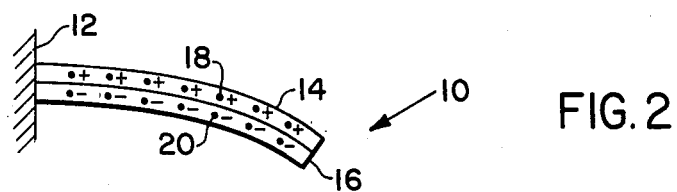
FIGS. 2 through 5 illustrate controlled deflections of the laminated composite shown in FIG. 1.

Referring now to FIG. 2, a positive charge, +, is placed on all the filaments 18 in the layer 14 while a negative charge, −, is placed on all of the filaments 20 in the layer 16. This causes the beam to deflect in a direction toward the filaments 20.

Figure 3:
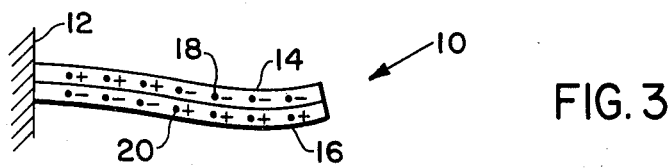

In the embodiment shown in FIG. 3 a positive charge, +, is placed on the filaments 18 that are adjacent to the wall 12 while a negative charge, −, is placed on the adjacent filaments 20. However, a negative charge, −, is placed on the filaments 18 remote from the wall 12 while a positive charge, +, is placed on the adjacent filaments in the layer 16. This produces a deflection in the end of the beam 10 that is opposite to the deflection of the beam at the end portion adjacent to the wall 12.

Figure 4:
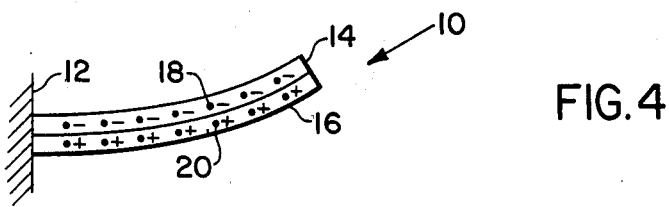

Referring now to FIG. 4, negative charges, −, placed on the filaments 18 and positive charges, +, placed on the filaments 20 produce a deflection that is opposite that shown in FIG. 2. It will be appreciated that changing the charges on the filaments 18 and 20 alternately from positive to negative will produce a dynamic response wherein the deflection oscillates between the position shown in FIG. 2 and that shown in FIG. 4.

Figure 5:
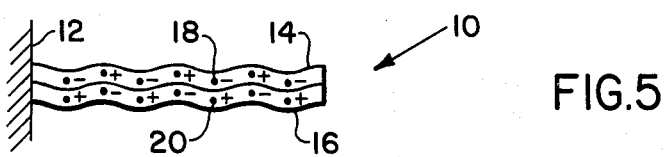

By placing alternate charges on the filaments 18 and 20, as shown in FIG. 5, a sine wave-like configuration is produced. Here again, by alternating the charges on the filaments 18 and 20 a dynamic response will be produced.

The precise nature and orientation of each of the laminates or layers 14 and 16 within the laminated structure of the beam 10 is governed by the purpose of the structure and those characteristics to be controlled. This simplifies solutions to complex system designs with inherent advantages in performance, weight, and cost.

More particularly, this laminated structure may be made to change shape and position directly without the need for discrete motive components. By way of example, aerodynamic surfaces may be positioned without the use of discrete mechanical drives. Also, these materials provide for fundmanetally new approaches to conventional problems, such as surface "dither" on aerodynamic surfaces, to effect boundary layer distributions and wave drag phenomena.

These composite materials also may be used in prosthetic devices. Mechanically tuned antenna reception/-transmission surfaces may utilize this material so that the surface of the antenna elements move in coincidence with the received E/M energy. These composite materials may be used in conveyors or pumps to move solid or liquid material with a propogating deflection or "controlled wave train".

This material can be used for direct electronic control of a composite material's shape, size, deflection, prestress and resonant frequency for both static and dynamic applications. While several modifications of the preferred embodiment of the composite structures have been described, it will be apparent that other modifications may be made to the disclosed structure without departing from the spirit of the invention or the scope of the subjoined claims.

More particularly, the composite structures have been described as laminates of piezoelectrically active matrix materials with electrically conductive filaments imbedded therein. This piezoelectrically active composite material structure also may comprise oriented and piezoelectrically active lamina of electrically conductive matrix materials with piezoelectrically active filaments or fibers. The composite structure may further utilize layers that are piezoelectrically active without conductive filaments, electrically conductive without piezoelectrically active filaments, or dielectric layers.

We claim:

1. A laminated structural device having the ability to change shape, position and resonant frequency without using discrete motive components comprising
   piezoelectrically active composites laminated together, each of said piezoelectrically active composites containing at least one electrically conductive member, and
   means for selectively placing a predetermined level of charge in said electrically conductive member thereby inducing a distortion in each of said piezoelectrically active composites whereby the device is deformed in a controlled manner.

2. A device as claimed in claim 1 including
   a first layer of piezoelectrically active matrix material,
   a second layer of piezoelectrically active matrix material laminated to said first layer,
   a plurality of electrically conductive filaments imbedded in each of said layers, and
   said means places a predetermined level of charge in each of said filaments.

3. A device as claimed in claim 2 wherein the piezoelectrically active matrix material of each of said layers is lithium niobate.

4. A device as claimed in claim 2 wherein the filaments are substantially parallel in each of said layers.

5. A laminated structural device having the ability to change shape, position and resonant frequency without using discrete motive components comprising
   electrically conductive composites laminated together, each of said electrically conductive composites containing at least one piezoelectrically active member, and
   means for selectively placing a predetermined level of charge in said electrically conductive composites thereby inducing distortion in each of said piezoelectrically active members whereby the device is deformed in a controlled manner.

6. A device as claimed in claim 5 including
   a first layer of electrically conductive matrix material,
   a second layer of electrically conductive matrix material laminated to said first layer,
   a plurality of piezoelectrically active filaments imbedded in each of said layers, and
   said means place a predetermined level of charge on each of said layers of matrix material.

7. A device as claimed in claim 6 wherein the filaments are substantially parallel in each of said layers.

8. A device as claimed in claim 6 wherein the filaments are lithium niobate.

* * * * *